(12) United States Patent
Liu et al.

(10) Patent No.: US 9,805,756 B2
(45) Date of Patent: Oct. 31, 2017

(54) WRITER POLE FORMATION

(71) Applicant: Seagate Technology LLC, Cupertino, CA (US)

(72) Inventors: Yi Liu, Edina, MN (US); Aaron M. Bowser, St. Paul, MN (US); Dan Yu, Shakopee, MN (US); Xiaohong Zhang, Eden Prairie, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 0 days.

(21) Appl. No.: 15/202,373

(22) Filed: Jul. 5, 2016

(65) Prior Publication Data

US 2016/0314810 A1    Oct. 27, 2016

Related U.S. Application Data

(62) Division of application No. 14/503,589, filed on Oct. 1, 2014, now Pat. No. 9,411,234.

(51) Int. Cl.
| | |
|---|---|
| *G11B 5/31* | (2006.01) |
| *G11B 5/84* | (2006.01) |
| *G03F 7/20* | (2006.01) |
| *C23F 1/02* | (2006.01) |
| *C23F 4/04* | (2006.01) |
| *G11B 5/855* | (2006.01) |
| *G03F 9/00* | (2006.01) |
| *C09K 13/00* | (2006.01) |

(52) U.S. Cl.
CPC .............. *G11B 5/8404* (2013.01); *C23F 1/02* (2013.01); *C23F 4/04* (2013.01); *G03F 7/20* (2013.01); *G03F 9/708* (2013.01); *G11B 5/314* (2013.01); *G11B 5/855* (2013.01); *C09K 13/00* (2013.01); *H01L 2223/54426* (2013.01)

(58) Field of Classification Search
None
See application file for complete search history.

(56) References Cited

U.S. PATENT DOCUMENTS

| | | |
|---|---|---|
| 5,568,335 A | 10/1996 | Fontana et al. |
| 7,999,401 B2 | 8/2011 | Murai et al. |
| 8,191,238 B2 | 6/2012 | Demtchouk et al. |
| 8,259,411 B2 | 9/2012 | Yang et al. |
| 8,381,392 B2 | 2/2013 | Zou et al. |

(Continued)

*Primary Examiner* — Kevin M Bernatz
(74) *Attorney, Agent, or Firm* — Holzer Patel Drennan

(57) ABSTRACT

Implementations disclosed herein provide a method of reducing the topography at the alignment and overlay marks area during the writer pole photolithography process in order to reduce the wafer scale variation and reduce the writer pole photolithography process rework rate. In one implementation, an intermediate stage of a wafer for writer pole formation is generated by removing a part of at least one metallic writer pole layer on top of an intermediate stage writer pole wafer to form a recovery trench, depositing an optically transparent material on top of the wafer, wherein the thickness of the optically transparent material is higher than a target recovery trench topography, forming a photoresist pattern on top of the optically transparent material over the recovery trench, etching the optically transparent material, and removing the photoresist pattern and at least part of the remaining optically transparent material.

19 Claims, 5 Drawing Sheets

(56) References Cited

U.S. PATENT DOCUMENTS

| | | | |
|---|---|---|---|
| 8,681,594 B1* | 3/2014 | Shi | G11B 5/6088 369/112.27 |
| 8,721,902 B1 | 5/2014 | Wang et al. | |
| 8,790,523 B2 | 7/2014 | Watanabe et al. | |
| 2006/0023353 A1* | 2/2006 | Lam | G11B 5/3116 360/125.35 |
| 2006/0034012 A1* | 2/2006 | Lam | G11B 5/3116 360/123.4 |
| 2007/0210394 A1 | 9/2007 | Kanakasabapathy et al. | |
| 2007/0230046 A1 | 10/2007 | Le et al. | |
| 2007/0247750 A1* | 10/2007 | Hsiao | G11B 5/1278 360/125.06 |
| 2008/0151437 A1 | 6/2008 | Chen et al. | |
| 2010/0187120 A1 | 7/2010 | Seets et al. | |
| 2010/0321835 A1* | 12/2010 | Zhang | G11B 5/3116 360/319 |
| 2011/0212388 A1* | 9/2011 | Du | G03F 1/32 430/5 |
| 2012/0236437 A1 | 9/2012 | Kautzky | |
| 2013/0010387 A1 | 1/2013 | Yang et al. | |
| 2013/0161185 A1* | 6/2013 | Mao | G11B 5/3163 204/192.34 |

* cited by examiner

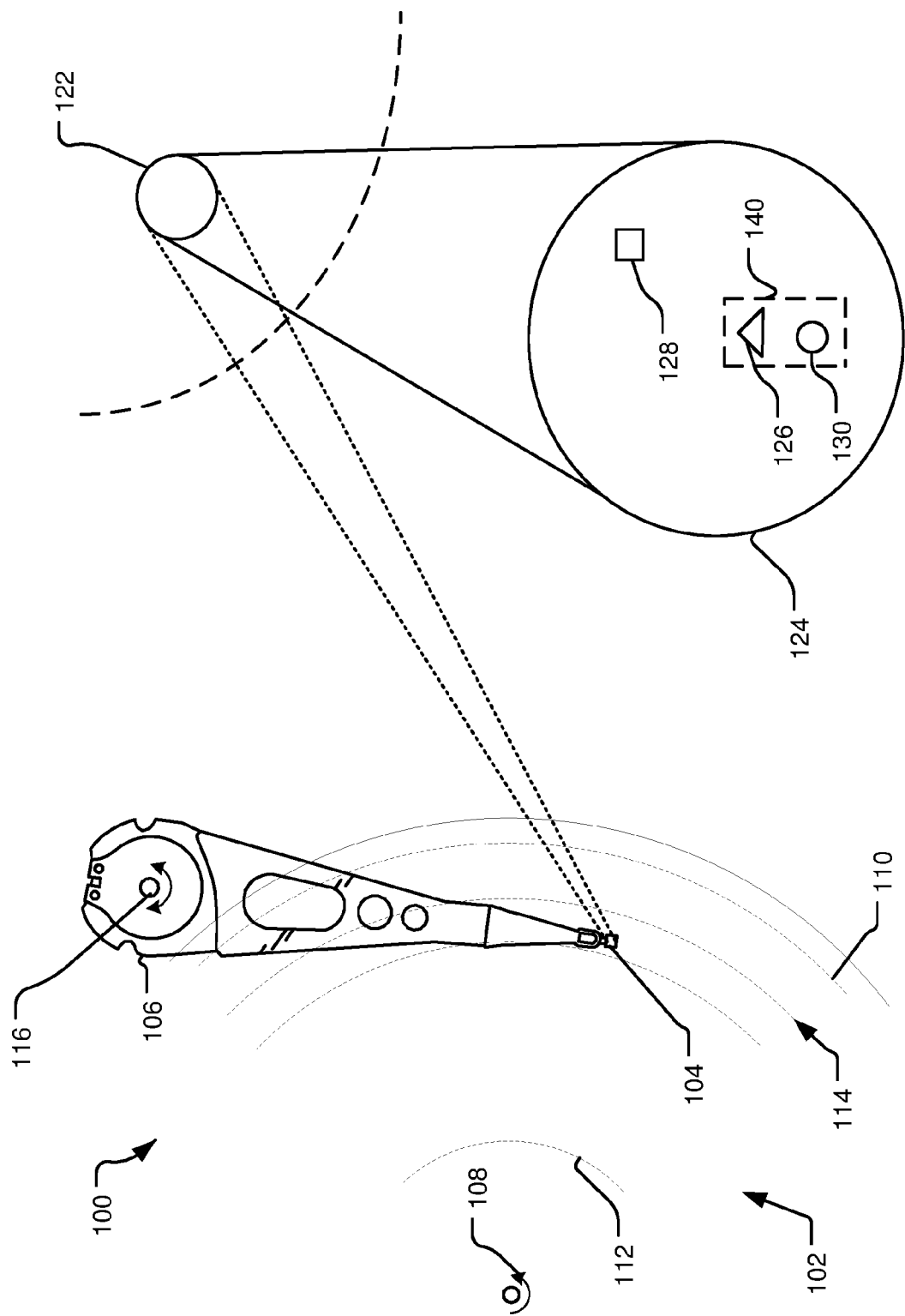

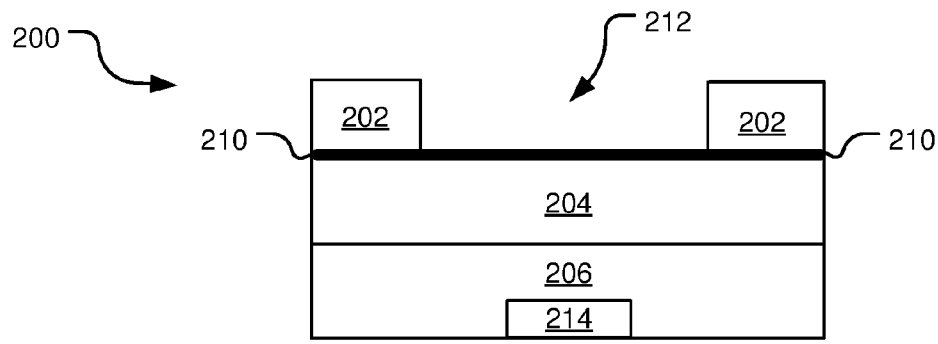
FIG. 2A
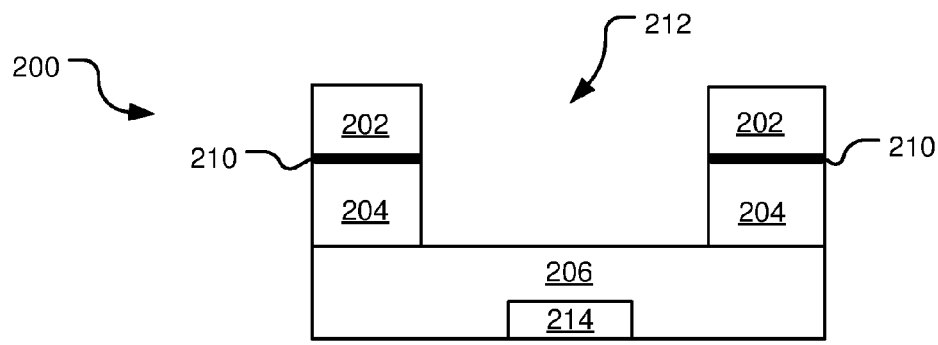
FIG. 2B
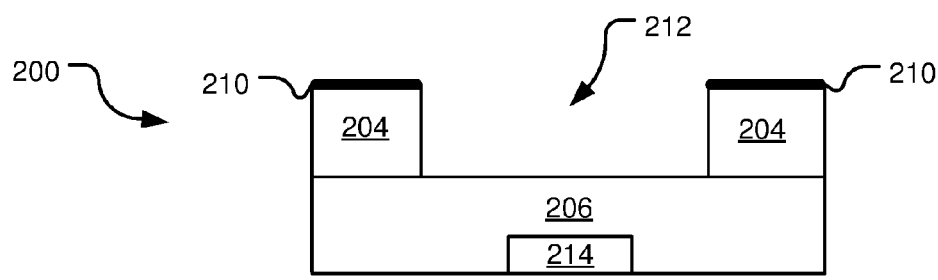
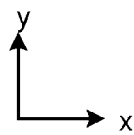
FIG. 2C

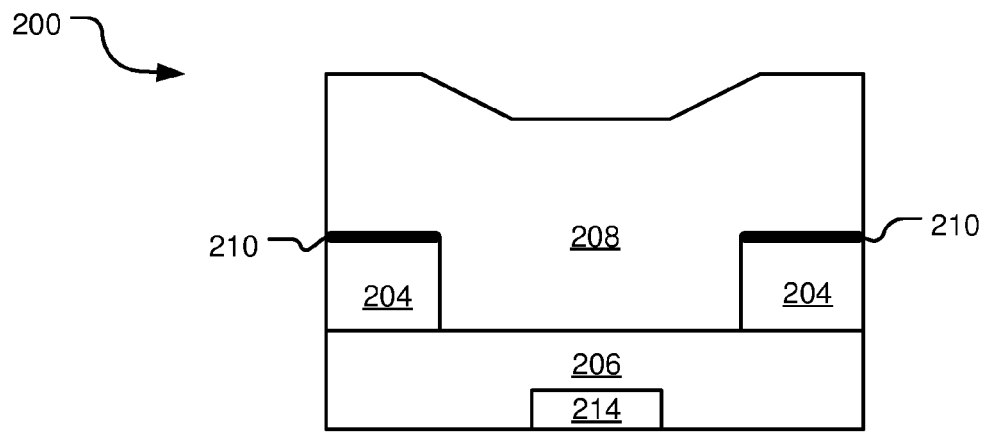
FIG. 2D
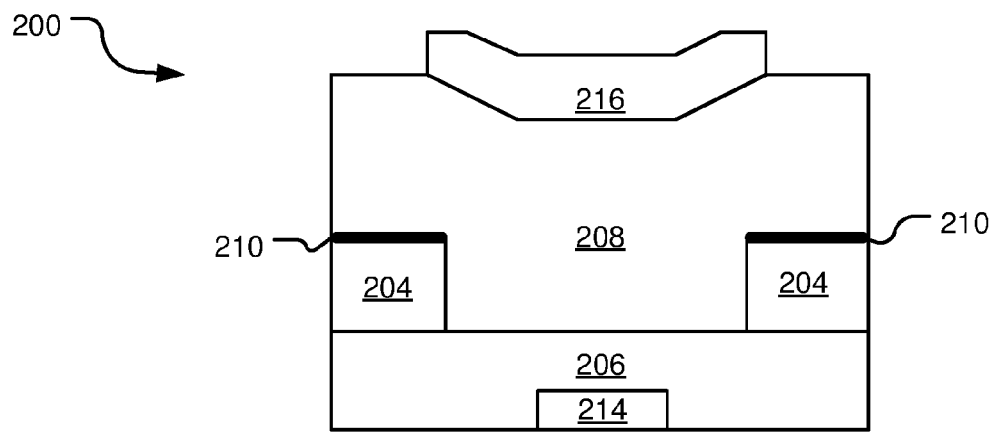
FIG. 2E
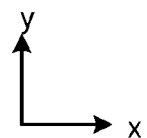

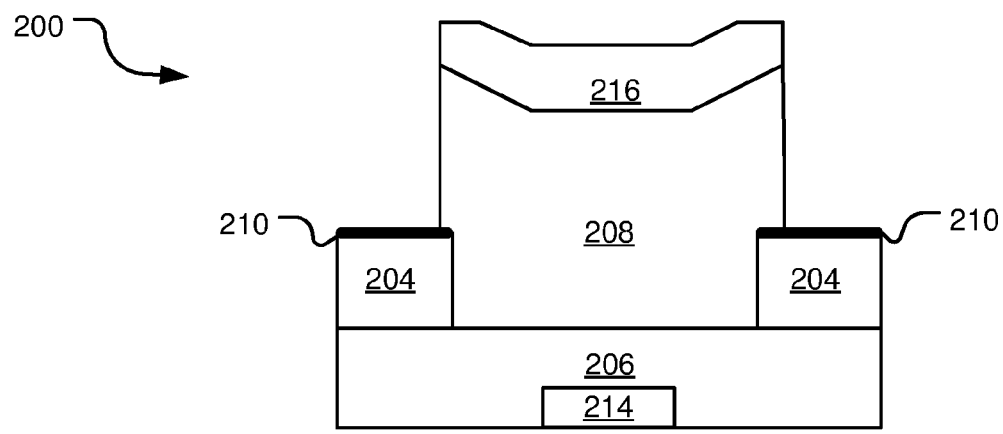
FIG. 2F
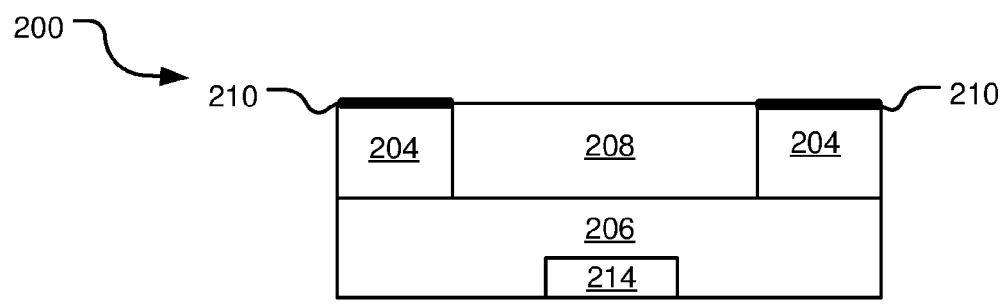
FIG. 2G
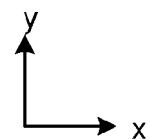

WRITER POLE FORMATION

PRIORITY CLAIM

This application is a divisional application of U.S. application Ser. No. 14/503,589 filed Oct. 1, 2014, now issued as U.S. Pat. No. 9,411,234, the entire disclosures of which are incorporated herein by reference for all purposes.

BACKGROUND

A magnetic head for recording generally consists of two portions, a writer portion for storing magnetically-encoded information on a magnetic media (disc) and a reader portion for retrieving that magnetically-encoded information from the media. The writer portion of the magnetic head typically consists of a main pole and a return pole which are magnetically separated from each other at an air bearing surface (ABS) of the writer by a nonmagnetic gap layer, and which are magnetically connected to each other at a region distal from the ABS by a back gap closure. In recording head fabrication process, the writer pole is fabricated from a writer pole wafer.

SUMMARY

Implementations disclosed herein provide a method of reducing the topography at the alignment and overlay marks areas during the writer pole photolithography process in order to reduce the wafer scale variation and reduce the writer pole photolithography process rework rate. In one implementation, an intermediate stage of a wafer for writer pole formation is generated by removing a part of at least one metallic writer pole layer on top of an intermediate stage writer pole wafer to form a recovery trench, depositing an optically transparent material on top of the wafer, wherein the thickness of the optically transparent material is higher than a target recovery trench topography, forming a photoresist pattern on top of the optically transparent material over the recovery trench, etching the optically transparent material, and removing the photoresist pattern and at least part of the remaining optically transparent material.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

FIG. 1 illustrates a schematic block diagram illustrating an example writer pole structure implemented on an end of an actuator assembly.

FIGS. 2A-2G illustrate block diagrams of a side view of an example writer pole structure during a method of reducing the topography in the writer pole structure.

DETAILED DESCRIPTIONS

Figure 3:
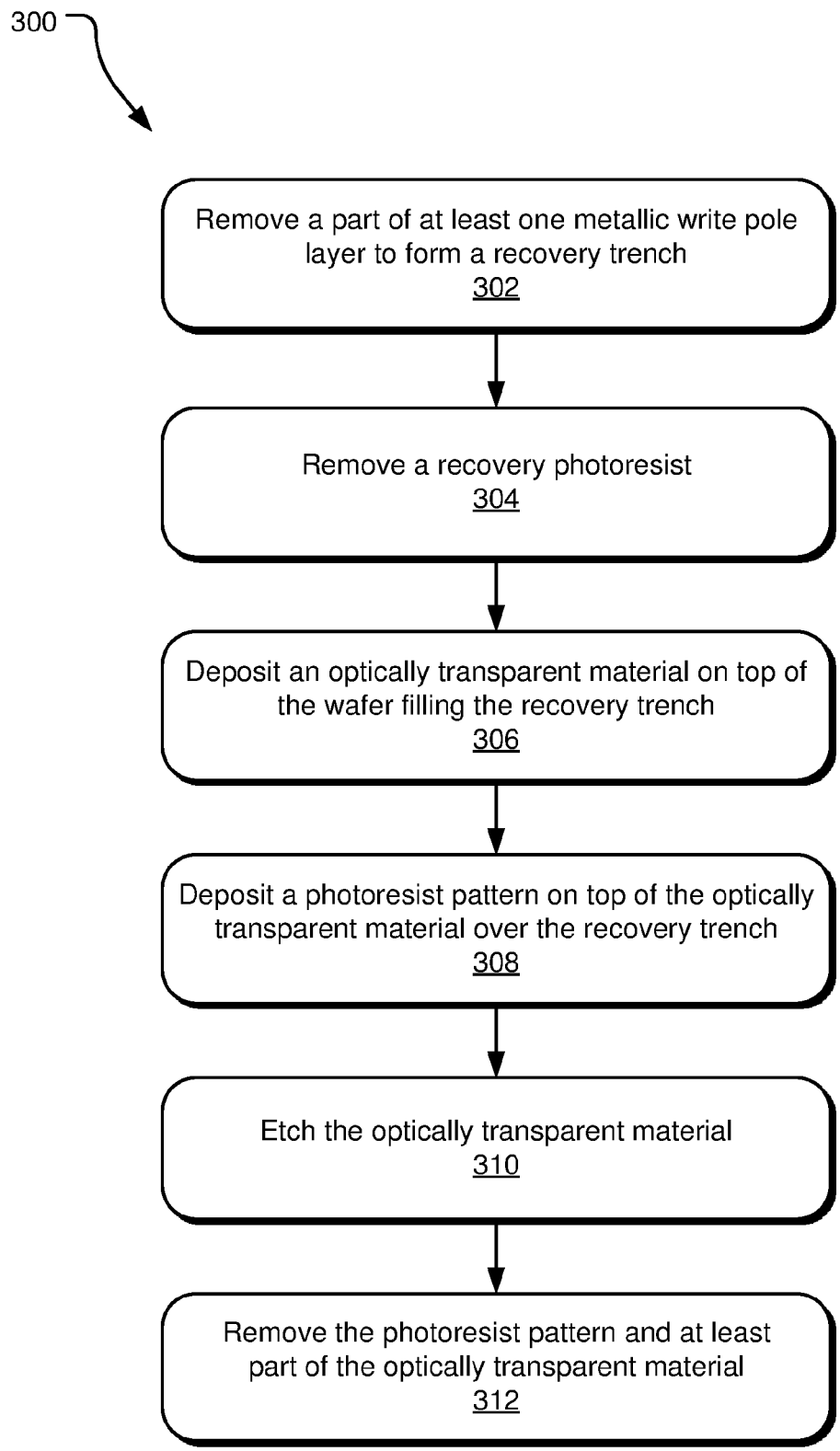
FIG. 3 illustrates example operations of reducing the topography in a writer pole structure.

During the recording head fabrication process, the writer pole is fabricated from a writer pole wafer. The distance from a writer pole break point to the air bearing surface (ABS) can affect the writing performance (e.g., the writer field gradient, etc.) The writer pole photolithography process can define the break point location. Specifically, the alignment and overlay control of the writer pole photolithography process determines the break point position across a whole wafer, and therefore, determines the whole wafer yield related with the writer performance.

In some implementations, the design requirement for a writer pole break point can be approximately 18 nm from the target. In order to meet a downstream writer pole break point specification, the in-room specification for the break point may be quite small (e.g., mean specification of approximately 10 nm). However, the writer pole photolithography process is not capable for such a small specification, and can result in a very high rework rate (approximately 40%), thus decreasing the wafer yield. The high rework at the writer pole photolithography process not only increases the process and the product cycle time, but can also reduce scanner utilization. Further, multiple rework during the writer pole photolithography process increases a risk to damage the writer pole metal stack and to cause scrapping of the wafer. Thus, it is important to reduce the rate of any rework.

During writer pole formation in the recording head fabrication process, alignment marks and overlay marks are used to align the wafer with various process tools. The components that make up integrated circuits in a semiconductor device are fabricated by aligning multiple layers with reference to alignment marks. Alignment marks are the areas where patterns can be transferred on the surface of a wafer by exposing a photoresist pattern. The overlay marks are areas that measure misalignment between two successive patterned layers on the surface of a wafer. The overlay marks confirm whether the photoresist pattern is in the right place following pattern transfer.

Typically, alignment and overlay marks are located on the bottom surface of the wafer and they are optically detected by process tools that may be located over the top surface of the wafer. An intermediate stage of the wafer may include one or more metallic layer on the top surface of the wafer. As a result, the alignment and overlay marks may be obscured by deposited metallic layers. Therefore, it is necessary to have transparent material over the alignment marks and overlay marks to facilitate detection of such marks.

Recovery processes to recover alignment and overlay marks use positioning and photolithographic masking and etching techniques to remove the obscuring layers proximate to the area of the alignment marks and overlay marks. In some recovery process cases, the recovered alignment area and the overlay mark area can be over milled. As a result, there may be a large topography or depth of the recovery trench, in some cases as much as 700 nm. For example, the recovery trench can be very deep due to a thick writer pole metal stack. The large recovery trench from the recovery process can cause uneven coating of the photoresist layer across the alignment mark and overlay mark area in photolithography. The photoresist material is a viscous polymer material. Once the photoresist material is placed on a wafer and spun, it becomes thinner as it floats across the wafer due to centrifugal force, resulting in an uneven top surface area.

On the other hand, if the topography or depth of the recovery trench is smaller, there are less imaging resist shadowing effects to a scanner, because the filled resist in the trench is much less or negligible. Additionally, large topography of the recovery trench also adversely affects photomask application. Photomask application relies on evenness of the surface and high topography of the recovery trench may result in increased unevenness of the top surface of the wafer. The higher topography of the recovery trench and the unevenness of the top surface of the wafer may result in changes in optical signals reflected from the wafer. For example, due to roughness on the surface of the wafer, light signals are reflected from the surface of the wafer at an angle. This adversely affects accuracy and precision due to increased errors in tool alignment, and results in critical geometry errors with respect to the break point position and overlay inconsistencies, all requiring wafer rework. Therefore, a substantially flat, uniform top surface area of the wafer is desired for better photo-masking performance.

The technology disclosed herein includes a method of reducing the topography at the alignment and overlay marks area in a portion of the wafer before the writer pole photolithography process in order to reduce the wafer scale variation and reduce the writer pole photolithography process rework rate.

FIG. 1 illustrates a schematic block diagram 100 illustrating an example of a writer pole structure implemented on an end of an actuator assembly. Specifically, FIG. 1 illustrates a plan view of an implementation of a disc 102 with a transducer head 104 situated on an end of an actuator assembly 106. Disc 102 rotates about a disc axis of rotation 108 during operation. Further, disc 102 includes an outer diameter 110 and inner diameter 112 between which are a number of data tracks 114, illustrated by circular dotted lines. Data tracks 114 are substantially circular and are made up of regularly spaced patterned bits.

Information may be written to and read from the patterned bits on the data tracks 114 through the use of the actuator assembly 106, which rotates during a data track 114 seek operation about an actuator axis of rotation 116 positioned adjacent the disc 102. The transducer head 104 mounted on the actuator assembly 106 at an end distal the actuator axis of rotation 116 flies in close proximity above the surface of the disc 102 during disc operation. The transducer head 104 includes a read pole for reading data from the data track 114 and a writer pole for writing data to the data track 114.

In one implementation of the transducer head, the writer pole of the transducer head 104 is formed from a recording head wafer 122. The recording head wafer 122 comprises of many layers of interactive elements. A top view 124 of the recording head wafer 122 shows various components that may be located on or underneath the recording head wafer 122. For example, an overlay mark 126, an alignment mark 128, and writer pole feature 130 (depicted as a circle, triangle and square for illustration of location only) may be located on one of the surfaces of the recording head wafer 122. For example, the alignment mark 128 and the overlay mark 126 may be used to align a photomasking tool on top of the recording head wafer 122 to locate a photomask. For example, such photomask may be used to form the writer pole feature 130.

When the overlay mark 126 and the alignment mark 128 are formed on the bottom of the recording head wafer 122, they may be obscured from a photomasking tool positioned over the top surface of the recording head wafer 122. To ensure that the overlay measurement tool and photomasking tool can communicate with the overlay mark 126 and the alignment mark 128, a layer from the top of the recording head wafer 122 can be removed to form a recovery trench 140. However, the recovery trench 140 results in higher topography and unevenness of the top surface of the recording head wafer 122. This, in turn, results in poor alignment of the photomasking tool on top of the recording head wafer 122 and therefore, low wafer yield.

To reduce the topography of the recording head wafer 122, an implementation disclosed herein provides for depositing a layer of optically transparent material on top surface of the recording head wafer 122. For example, the layer of optically transparent material may be alumina. Subsequently, a photoresist pattern is generated using optical lithography on top of the optically transparent material over the recovery trench and the optically transparent material is etched, for example, using wet etching process. The remaining optically transparent material is removed to cause the trench to be filled with the optically transparent material without causing any increase in the topography of the top surface of the recording pole wafer 122. As a result, a photomasking tool above the top surface of the recording head wafer 122 is able to optically identify the overlay mark 126 and the alignment mark 128.

FIGS. 2A-G illustrates cross-sectional views of a portion of a writer pole wafer at different stages of manufacturing a writer pole. Specifically, FIGS. 2A-G show block diagrams of steps in a method to reduce the topography at the alignment mark areas and overlay mark areas in the writer pole wafer. Various stages of writer pole wafer in FIGS. 2A-G are shown to have the ABS of the writer pole defined by the surface having the x and y axis as shown in FIGS. 2A-G.

As shown in FIG. 2A, writer pole material comprising metallic layers or a metal stack 204 is deposited onto a base portion or substrate 206 the recording head wafer 200. The base portion 206 can include various layers that have been previously applied. The base portion 206 can be any suitable non-magnetic material (e.g., alumina). The recording head wafer 200 may be provided with various marks 214, which include an alignment mark (not shown), an overlay mark (not shown), etc. A recovery photoresist 202 is patterned, in areas on top of a chemical mechanical polish layer 210 (e.g., Cr), which covers writer pole material, or metal stack 204, in the recording head wafer 200. Specifically, the recovery photoresist 202 is deposited on the top of the recording head wafer 200 away in areas other than the area above the marks 214 so as to create a recovery trench 212. While FIG. 2A illustrates the recovery photoresist to be on the two sides of the area above recovery trench 212, FIG. 2A is a two-dimensional side view. In practice, the recovery photoresist 202 may be deposited on all sides of the recovery trench 212.

Subsequently, a recovery milling process (e.g., ion milling) removes a part of at least one layers of the metal stack 204 on the recording head wafer 200, as shown in FIG. 2B. In some implementations, the recovery mill is optimized to have approximately 10% of over-mill instead of the original 50% of over-mill. In some implementations, such reduction in the milling can decrease the topography of the recording head wafer 200 from 770 nm to 670 nm. The recovery milling process results in a void, or the recovery trench 212, in the writer pole wafer 200. After the recovery mill, a resist stripping process takes place to remove the photoresist 202, as shown in FIG. 2C. Thus, the recording head wafer 200 as shown in FIG. 2C has the recovery trench 212 surrounded by the writer pole metal 204 only.

In FIG. 2D, an optically transparent material 208 (e.g., alumina, silicon dioxide) is deposited on top of the recording head wafer 200 filling the recovery trench 212, wherein the thickness of the optically transparent material is higher than a target recovery trench topography. A variety of film deposition methods may be used to deposit the layer of optically transparent material 208 (e.g., sputtering, plasma enhanced vapor deposition, atomic layer deposition, etc.)

Filling the recovery trench 212 with an optically transparent material such as alumina does not affect the overlay and the alignment light pass through.

In FIG. 2E, a photoresist 216 is deposited on top of the optically transparent material 208 positioned over the recovery trench area only. The photoresist 216 is not placed over the optically transparent material 208 positioned over the remaining metal stack 204.

In FIG. 2F, the optically transparent material 208 positioned over the remaining metal stack 204 is etched. These are the areas not covered and protected by the photoresist pattern. The optically transparent material 208 can be wet etched or dry etched, and can leave sharp edges on the sides of the optically transparent material 208 and photoresist 216.

In FIG. 2G, the photoresist 216 is removed by stripping chemical, and at least part of the remaining part of the optically transparent material 208 is removed with a chemical mechanical polish process, leaving a substantially flat surface area, or target recovery trench topography. In some implementations, the topography, which can be as much as 770 nm after the recovery process mill, can be reduced to approximately 20 nm. The flat surface over the alignment area and the overlay area will solve the resist "fence" problem during the coating, and reduce the overlay scale wafer to a wafer sigma by approximately 50%.

FIG. 3 illustrates example operations for reducing the topography at the alignment and overlay marks area during the writer pole formation process in order to reduce the wafer scale variation and reduce the writer pole photolithography process rework rate. The operations disclosed in FIG. 3 may be performed on a writer pole wafer having a substrate, writer pole layers on top of the substrate, and a layer of chromium on top of the writer pole metals. Furthermore, the writer pole wafer has marking features, such as an overlay mark and an alignment mark at the bottom of the substrate. The operations disclosed in FIG. 3 allows for creating a recovery trench and backfilling the recovery trench with an optically transparent material such as alumina. As a result, the marking features become visible to any photomasking tool positioned on top of the writer pole wafer. Furthermore, the topography of the top surface of the writer pole wafer is also reduced to improve the functioning of any photomasking tool.

In a removing operation 302, a part of at least one metallic writer pole layer on a wafer base portion or substrate is removed. As a result, a recovery trench is formed. A removing operation 304 removes a recovery photoresist, also located on the top of the wafer. A depositing operation 306 deposits an optically transparent material on top of the wafer filling the recovery trench, wherein the thickness of the optically transparent material is higher than a target recovery trench topography. In some implementations, the target recovery trench topography is a substantially flat top surface area.

A photolithography operation 308 generates a photoresist pattern on top of the optically transparent material over the recovery trench. In an etching operation 310, an optically transparent material is etched, either by wet etching or dry etching.

A removing operation 312 removes the photoresist pattern and at least part of the remaining part of the optically transparent material with a chemical mechanical polish. As a result, the remaining top surface of the wafer has a target recovery trench topography, a substantially flat top surface area, in preparation of writer pole fabrication.

The above specification, examples, and data provide a complete description of the structure and use of example implementations of the invention. Since many implementations of the invention can be made without departing from the spirit and scope of the invention, the invention resides in the claims hereinafter appended. Furthermore, structural features of the different implementations may be combined in yet another implementation without departing from the recited claims. The implementations described above and other implementations are within the scope of the following claims.

What is claimed is:

1. A wafer, comprising:
   a substrate,
   a writer pole material deposited on top of the substrate;
   a recovery trench positioned in between the writer pole material and above the substrate; and
   an optically transparent material deposited into the recovery trench, wherein the top of the optically transparent material is etched so as to be substantially aligned to the top surface of the writer pole material and the optically transparent material substantially fills the entirety of the recovery trench.

2. The wafer of claim 1, further comprising at least one of an overlay mark and an alignment mark on a bottom surface of the substrate.

3. The wafer of claim 1, wherein the optically transparent material is etched in a wet etching process.

4. The wafer of claim 1, wherein the optically transparent material is alumina.

5. The wafer of claim 1, wherein depositing the optically transparent material is performed by sputtering.

6. The wafer of claim 1, wherein depositing the optically transparent material is performed by plasma enhanced vapor deposition.

7. The wafer of claim 1, wherein depositing the optically transparent material is performed by atomic layer deposition.

8. The wafer of claim 1, further comprising a photoresist pattern formed on top of the optically transparent material over the recovery trench.

9. The wafer of claim 8, wherein the photoresist pattern and at least part of a remaining optically transparent material is removed.

10. The wafer of claim 9, wherein least part of the optically transparent material is removed with a chemical mechanical process.

11. The wafer of claim 8, wherein etching the optically transparent material includes etching optically transparent material on the top of the wafer on sides of the photoresist pattern generated over the recovery trench.

12. The wafer of claim 8, wherein forming the photoresist pattern includes performing photolithography.

13. An intermediate stage writer pole wafer comprising:
    a substrate,
    writer pole material deposited on top of the substrate;
    a recovery trench positioned in between writer pole material and above the substrate; and
    alumina, wherein the top surface of the alumina is substantially at a same level as the top level of the remainder of the wafer and the alumina substantially fills the entirety of the recovery trench.

14. The intermediate stage writer pole wafer of claim 13, wherein the recovery trench is located over at least one of an overlay mark and an alignment mark of the wafer.

15. The intermediate stage writer pole wafer of claim 13, wherein depositing the alumina is performed by one of sputtering, plasma enhanced vapor deposition, and plasma enhanced vapor deposition.

16. The wafer of claim 13, further comprising a photoresist pattern formed on top of the alumina over the recovery trench.

17. The intermediate stage writer pole wafer of claim 16, wherein the alumina is wet etched, the photoresist is chemically removed, and at least part of a remaining part of the alumina is removed.

18. The intermediate stage writer pole wafer of claim 17, wherein wet etching the alumina includes etching alumina on the top of the wafer on sides of a photoresist pattern generated over the recovery trench.

19. The intermediate stage writer pole wafer of claim 16, wherein forming the photoresist pattern includes performing photolithography.

* * * * *